United States Patent
Kothamasa et al.

(10) Patent No.: US 9,961,786 B2
(45) Date of Patent: May 1, 2018

(54) METHOD AND STRUCTURE FOR LIMITING COVER DEFLECTION IN AN ECU WHEN EXPOSED TO HIGH ALTITUDE ENVIRONMENTS

(71) Applicant: Continental Automotive Systems, Inc., Auburn Hills, MI (US)

(72) Inventors: Ravi Kiran Kothamasa, Rochester Hills, MI (US); Kevin D. Moore, Hoffmann Estates, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 311 days.

(21) Appl. No.: 14/083,566

(22) Filed: Nov. 19, 2013

(65) Prior Publication Data
US 2015/0138738 A1    May 21, 2015

(51) Int. Cl.
*H05K 5/00*    (2006.01)

(52) U.S. Cl.
CPC .................. *H05K 5/0052* (2013.01)

(58) Field of Classification Search
CPC .. H05K 5/0052; H05K 5/0065; H05K 5/0069; H05K 5/006; H05K 5/0091; H05K 5/0082
See application file for complete search history.

(56) References Cited

U.S. PATENT DOCUMENTS

| | | | | |
|---|---|---|---|---|
| 4,893,215 A | * | 1/1990 | Urushiwara | H05K 5/0052 174/535 |
| 5,003,824 A | * | 4/1991 | Fukada | G01H 11/08 310/331 |
| 6,094,984 A | * | 8/2000 | Asano | G01P 1/023 73/493 |
| 6,160,708 A | * | 12/2000 | Loibl | B60R 16/0239 174/266 |
| 6,407,925 B1 | * | 6/2002 | Kobayashi | H05K 5/062 200/61.88 |
| 6,728,110 B2 | * | 4/2004 | Koyama | H05K 5/0073 361/752 |
| 2002/0141143 A1 | * | 10/2002 | Yamane | B60R 16/0238 361/601 |
| 2003/0133280 A1 | * | 7/2003 | Tsuzuki | H05K 7/142 361/797 |
| 2003/0151893 A1 | * | 8/2003 | Meyer | H02M 1/44 361/688 |
| 2005/0048850 A1 | * | 3/2005 | Zoller | B60R 16/0239 439/761 |
| 2005/0146340 A1 | * | 7/2005 | Clark | G01D 11/245 324/756.07 |
| 2005/0190539 A1 | * | 9/2005 | Watanabe | H05K 7/20854 361/704 |

(Continued)

*Primary Examiner* — David M Sinclair
*Assistant Examiner* — Robert Brown

(57) ABSTRACT

An engine control unit (ECU) includes a housing, a cover sealingly engaged with the housing, a circuit board disposed in the housing and support structure disposed in the housing and associated with an inner surface of the cover. At least one fastener couples both the support structure and the circuit board to the housing. An adhesive bonds at least portions of the support structure to portions of the inner surface of the cover. The support structure is constructed and arranged to limit deflection of the cover when internal pressure increase in the ECU.

19 Claims, 3 Drawing Sheets

(56) References Cited

U.S. PATENT DOCUMENTS

| | | | | |
|---|---|---|---|---|
| 2006/0077642 A1* | 4/2006 | Estes | H05K 7/142 | 361/752 |
| 2007/0064403 A1* | 3/2007 | Badarinarayan | B23K 20/1265 | 361/796 |
| 2007/0109730 A1* | 5/2007 | Shigyo | H05K 5/0052 | 361/600 |
| 2008/0002377 A1* | 1/2008 | Kamoshida | H05K 5/0052 | 361/752 |
| 2008/0030932 A1* | 2/2008 | Shimazaki | H05K 5/0013 | 361/748 |
| 2008/0049476 A1* | 2/2008 | Azuma | B60L 3/12 | 363/131 |
| 2008/0053700 A1* | 3/2008 | O'Connor | B23K 20/122 | 174/564 |
| 2008/0259537 A1* | 10/2008 | Arisaka | G06F 1/203 | 361/679.08 |
| 2010/0014252 A1* | 1/2010 | Hamatani | H01G 2/106 | 361/707 |
| 2010/0097765 A1* | 4/2010 | Suzuki | B60K 6/365 | 361/699 |
| 2011/0051371 A1* | 3/2011 | Azuma | B60K 6/445 | 361/699 |
| 2011/0170269 A1* | 7/2011 | Blossfeld | H01R 43/18 | 361/752 |
| 2011/0193432 A1* | 8/2011 | Takechi | H02K 19/365 | 310/62 |
| 2011/0199800 A1* | 8/2011 | Yahata | H02M 7/003 | 363/131 |
| 2011/0292615 A1* | 12/2011 | Rai | H05K 1/0204 | 361/721 |
| 2012/0320531 A1* | 12/2012 | Hashimoto | H05K 5/0052 | 361/720 |
| 2012/0320544 A1* | 12/2012 | Ohhashi | H05K 5/0052 | 361/752 |
| 2013/0010426 A1* | 1/2013 | Nakano | H02K 11/0073 | 361/690 |
| 2013/0058044 A1* | 3/2013 | Watanabe | H05K 5/006 | 361/714 |
| 2013/0210256 A1* | 8/2013 | Hosokawa | H05K 5/0052 | 439/278 |
| 2014/0065877 A1* | 3/2014 | Ohhashi | H05K 5/0052 | 439/519 |
| 2014/0076772 A1* | 3/2014 | Azumi | H05K 5/069 | 206/706 |
| 2014/0085839 A1* | 3/2014 | Nakano | H05K 5/0052 | 361/752 |
| 2014/0144666 A1* | 5/2014 | Lisitschew | H05K 5/0004 | 174/50 |

* cited by examiner

METHOD AND STRUCTURE FOR LIMITING COVER DEFLECTION IN AN ECU WHEN EXPOSED TO HIGH ALTITUDE ENVIRONMENTS

FIELD

The invention relates to sealed engine control units (ECU) for automotive vehicles and, more particularly, to support structure for limiting deflection of a cover of the sealed ECU in high altitude environments

BACKGROUND

ECUs are control units typically installed in the engine compartment of a vehicle. The ECU typically controls many of the functions of the vehicle such as the fuel injector drivers, engine operations, etc., by controlling a series of actuators based on input from sensors.

Typical ECUs have a circuit board that is disposed in a housing. A cover, mounted to the housing, covers the circuit board. When a vehicle and thus the ECU are exposed to high altitudes, internal pressure can build up inside the ECU. In a sealed ECU where the cover is sealed with respect to the housing, such internal pressure may cause the cover to deflect outwardly, reducing the effectiveness of the sealing arrangement. Using a vent in the ECU could equalize the pressure inside the ECU, but this solution cannot be used when customer's demands a sealed ECU. Cover deflection can be limited by using a cast cover. However, a cast cover is expensive and very heavy.

Thus, there is a need in a sealed ECU to limit, in a cost-effective manner, deflection of the cover when internal pressure increases inside of the ECU.

SUMMARY

An object of the invention is to fulfill the needs referred to above. In accordance with the principles of an embodiment, this objective is obtained by an engine control unit (ECU) that includes a housing, a cover sealingly engaged with the housing, a circuit board disposed in the housing and support structure disposed in the housing and associated with an inner surface of the cover. At least one fastener couples both the support structure and the circuit board to the housing. An adhesive bonds at least portions of the support structure to portions of the inner surface of the cover. The support structure is constructed and arranged to limit deflection of the cover when internal pressure increases in the ECU.

In accordance with another aspect of an embodiment, a method provides rigidity to a cover of an engine control unit (ECU). The ECU has a housing and a circuit board. The circuit board has at least one mounting bore there-through. The circuit board is placed in the housing. Support structure is provided and has at least one bore there-through. The at least one bore of the support structure is then aligned with the at least one mounting bore of the circuit board. A fastener is provided through the aligned bores and the fastener is coupled to the housing to secure both the support structure and the circuit board to the housing. Adhesive is provided on at least portions of an upper surface of the support structure. The cover is placed in sealed relation with the housing, thereby compressing the adhesive between the upper surface of the support structure and an inner surface of the cover to bond the support structure to the cover.

Other objects, features and characteristics of the present invention, as well as the methods of operation and the functions of the related elements of the structure, the combination of parts and economics of manufacture will become more apparent upon consideration of the following detailed description and appended claims with reference to the accompanying drawings, all of which form a part of this specification.

BRIEF DESCRIPTION OF THE DRAWINGS

The invention will be better understood from the following detailed description of the preferred embodiments thereof, taken in conjunction with the accompanying drawings, wherein like reference numerals refer to like parts, in which.

DETAILED DESCRIPTION OF EXEMPLARY EMBODIMENT

Figure 1:
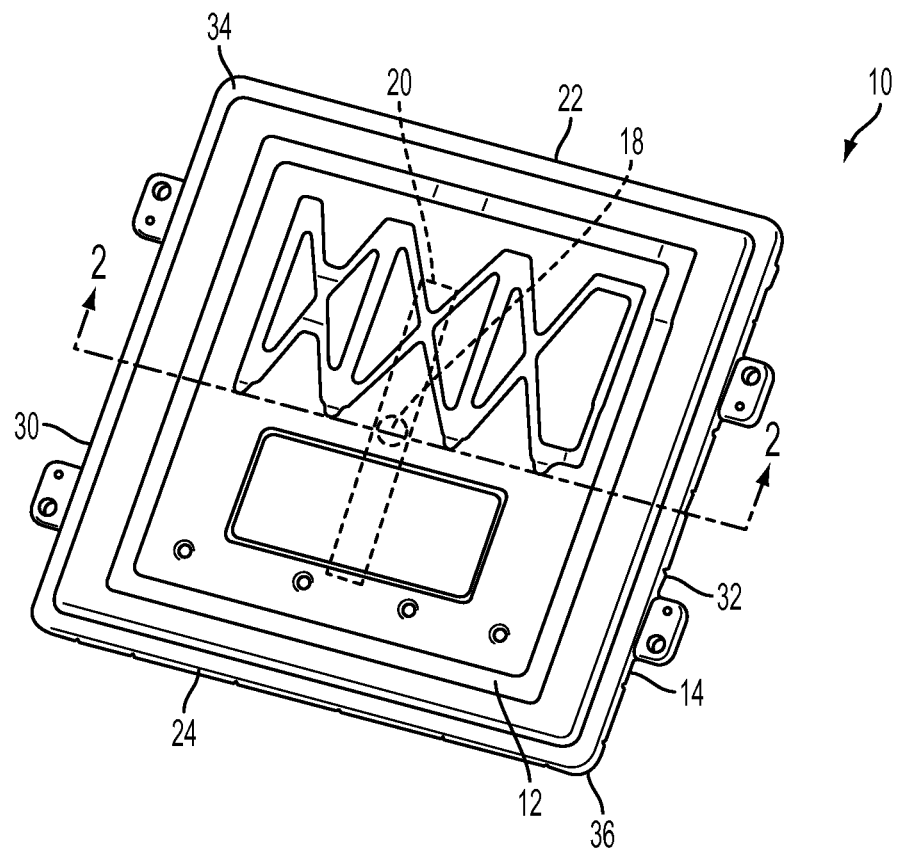
FIG. 1 top view of an ECU in accordance with an embodiment.
Figure 2:
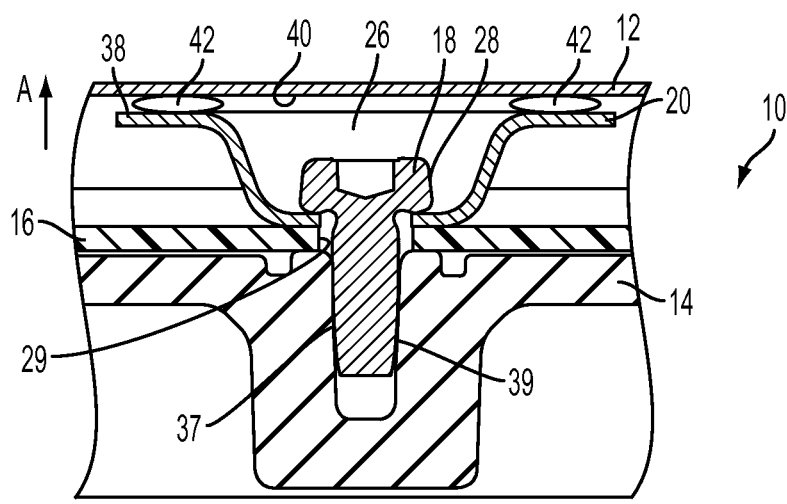
FIG. 2 is partial cross-sectional view of the ECU taken along the line 2-2 of FIG. 1, showing an embodiment of support structure coupled to a housing by a single fastener.
Figure 5:
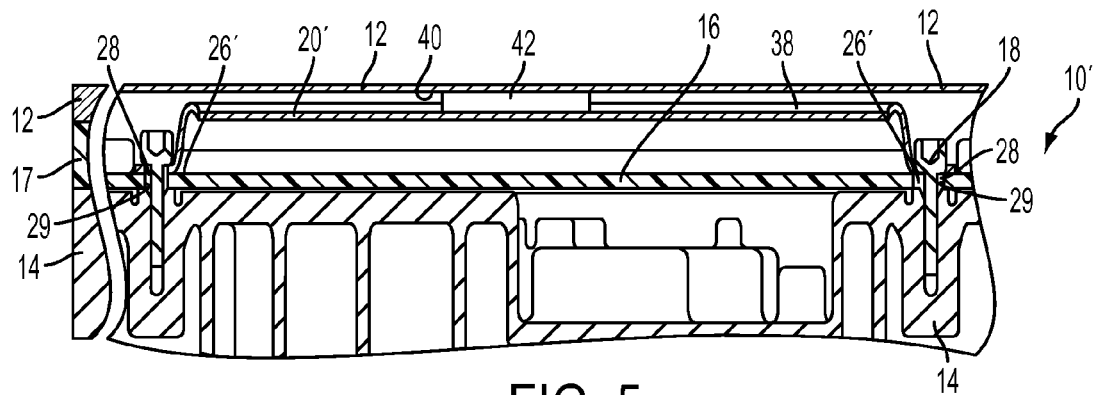
FIG. 5 is a sectional view taken along the line 5-5 of FIG. 3, showing an embodiment of support structure coupled to a housing by a pair of fasteners.

With reference to FIGS. 1 and 2, an ECU is shown, generally indicated at 10, for controlling operations of a vehicle. The ECU 10 has a cover 12 secured to housing 14. With reference to FIG. 2, the ECU 10 includes a circuit board 16 mounted to the housing 14 by at least one fastener 18. The cover 12, preferably of stamped metal such as steel or aluminum, is engaged with the housing in a sealed manner so as to protect the circuit board 16 by preventing the intrusion of moisture and/or foreign particles into the housing 14. Thus, a conventional sealing arrangement 17 (FIG. 5) is provided between the cover 12 and the housing 14.

Figure 3:
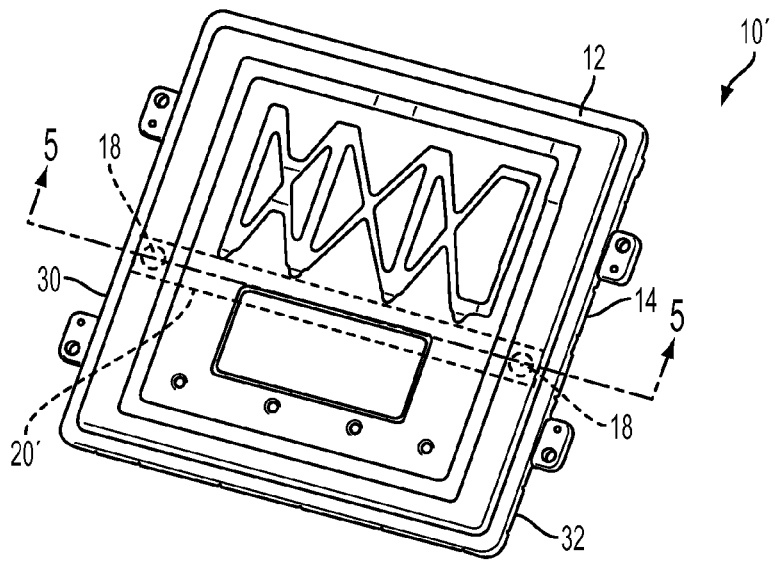
FIG. 3 top view of an ECU in accordance with another embodiment.
Figure 6:
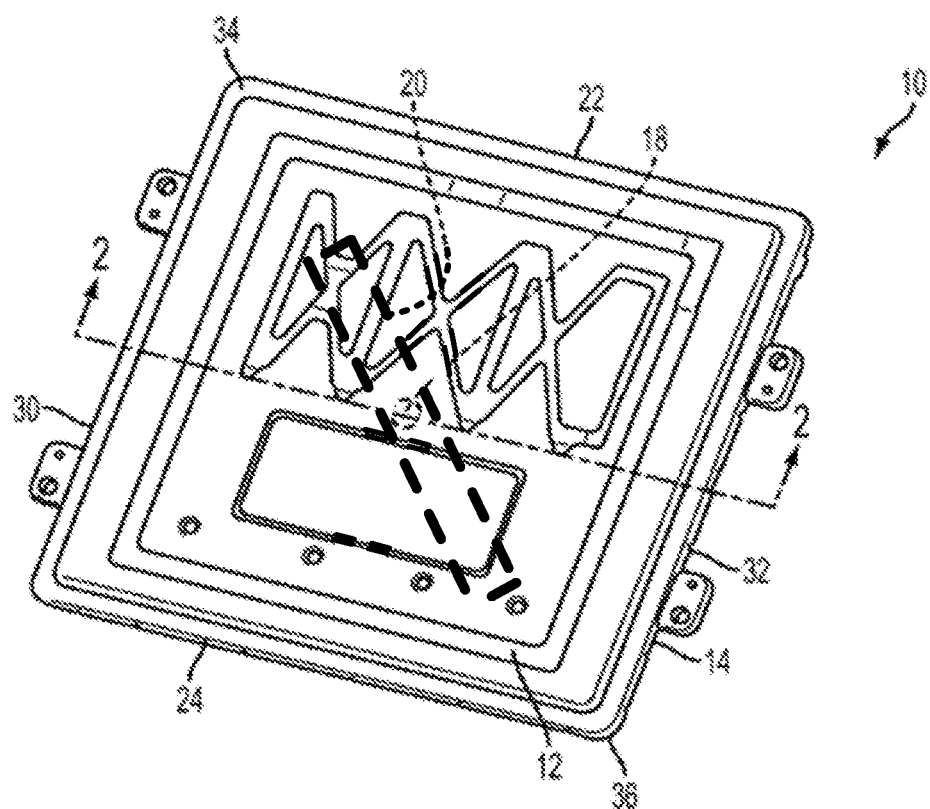
FIG. 6 is a top view of an ECU in accordance with another embodiment.

Since the ECU 10 is a sealed unit, when a vehicle employing the ECU 10 is exposed to high altitudes, internal pressure can build up inside the ECU 10, causing the cover 12 deflect outwardly (in the direction of arrow A), reducing the effectiveness of the sealing arrangement 17. Thus, to provide rigidity to the cover 12, in accordance with an embodiment, support structure 18 is associated with the cover 12. The support structure 20 in the form of an elongated, rigid plate, preferably of stamped steel, that extends across a portion of an inner surface of the cover 12. In the embodiment of FIG. 2, the support structure 20 extends generally from one side 22 of the cover 12 to the opposing side 24 thereof. The support structure 20 has a mounting portion 26, located generally centrally thereof, having a bore 28 there-through for receiving the fastener 18. The mounting portion 26 of the support structure 20 is placed over a generally centrally located mounting bore 29 of the circuit board 16. The fastener 18 is provided through bores 28 and 29 and into the housing 14 to secure both the circuit board 16 and the support structure 20 to the housing 14. In the embodiment, the cover 12 is generally square or rectangular. Since the fastener 18 is disposed generally centrally of the circuit board 16 and thus centrally of the cover 12, it can be appreciated that the support structure 20 can be oriented as FIG. 1, or can be oriented to extend substantially between sides 30 and 32 (see embodiment of FIG. 3), or can extend diagonally substantially between opposing corners 34 and 36 of the cover 12 (see embodiment of FIG. 6). The fastener 18 preferably has threads 37 and is threadedly engaged with threads 39 of the housing 14.

The support structure 20 also has a generally planar upper surface 38 disposed adjacent to a generally planar inner surface 40 of the cover 12 and spaced above the mounting portion 26 so that the fastener 18 is in a plane different from the plane of the upper surface 38. A sealant or adhesive 42 is provided on at least a portion of the upper surfaced 38 and when the cover 12 is secured to the housing 14, the sealant 42 is compressed between surfaces 38 and 40, creating a bond between the support structure 20 and the cover 16. Thus, support structure 20 limits deflection of the cover 12 when internal pressure builds up in the housing 14 and maintains the sealed arrangement of the ECU 10.

Figure 4:
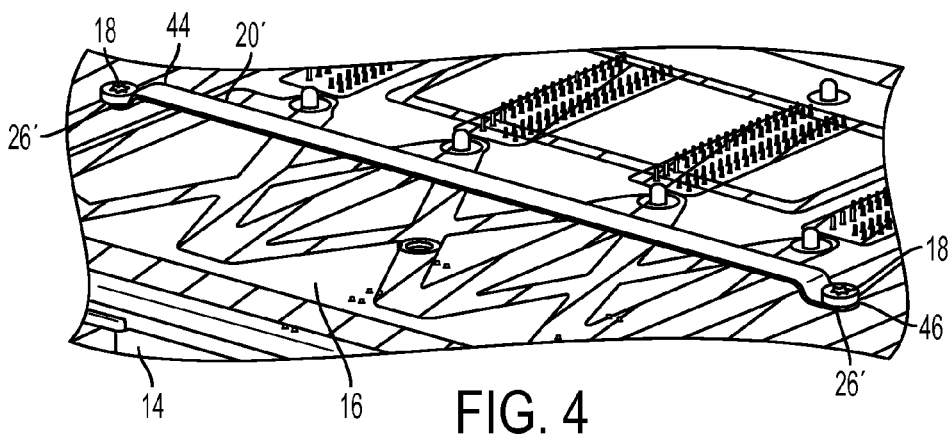
FIG. 4 is view of support structure of the ECU of FIG. 3, shown coupled over a circuit board and to the housing by a pair of fasteners.

Certain ECUs do not use the single, central fastener 18 to secure the circuit board 16 to the housing 14, but use two or more fasteners to secure the circuit board to the housing. In such a configuration and with reference to FIGS. 3-5, the ECU 10' includes a support structure 20' having at least two mounting portions 26' (FIG. 4), preferably at opposing ends 44 and 46 thereof. The bore 28 of each the mounting portion 26' of the support structure 20' is aligned with the corresponding bore 29 of the circuit board 16. A fastener 18 is provided through each bore set (aligned bores 28 and 29) and into the housing 14 to secure both the circuit board 16 and the support structure 20' to the housing 14. The support structure 20' is arranged so that at least a portion thereof is located generally centrally of the cover 12. The support structure 20' also has a generally planar upper surface 38 disposed adjacent to a generally planar inner surface 40 of the cover 12. A sealant or adhesive 42 is provided on the upper surfaced 38 and when the cover 12 is secured to the housing 14, the sealant 42 is compressed between surfaces 38 and 40, creating a bond between the support structure 20' and the cover 12. Thus, support structure 20' limits deflection of the cover 12 when internal pressure increases in the housing 14 and maintains the sealed arrangement of the ECU 10'.

The support structure 20, 20' limits deflection of the cover 12 to prevent permanent deformation of the cover 12 and also avoids any disturbance of the sealing arrangement between the cover 12 and the housing 14, thereby preventing failure of the ECU due to leaks. The support structure 20, 20' does not significantly increase the weight of the ECU and is less expensive than other solutions. Furthermore, since the existing fastener(s) that is used to secure the circuit board 16 to the housing 14 also secures the support structure 20, 20' to the housing 14, there is no need to modify the cover 12, housing 14, or the circuit board 16 of the ECU.

The foregoing preferred embodiments have been shown and described for the purposes of illustrating the structural and functional principles of the present invention, as well as illustrating the methods of employing the preferred embodiments and are subject to change without departing from such principles. Therefore, this invention includes all modifications encompassed within the spirit of the following claims.

What is claimed is:

1. An engine control unit (ECU) comprising:
a housing,
a cover sealingly engaged with the housing,
a circuit board disposed in the housing,
support structure disposed in the housing between the cover and the circuit board so as to be adjacent to an inner surface of the cover,
at least one fastener coupling both the support structure and the circuit board to the housing, and
an adhesive bonding at least one portion of the support structure to at least one portion of the inner surface of the cover, the adhesive contacting and disposed between the at least one portion of the support structure and the inner surface of the cover,
wherein the support structure is constructed and arranged to limit deflection of the cover when internal pressure increases in the ECU,
wherein the circuit board includes a mounting bore there-through, and the support structure includes a mounting portion having a bore there-through, the at least one fastener extending through the bore of the support structure and through the mounting bore of the circuit board in threaded engagement with the housing, the mounting bore of the circuit board, the bore of the mounting portion of the support structure and the at least one fastener are disposed in a longitudinally and laterally central portion of the housing, and
wherein the at least one fastener comprises a single fastener.

2. The ECU of claim 1, wherein the cover is composed of stamped metal and the support structure is a metal support structure.

3. The ECU of claim 1, wherein the support structure is an elongated, rigid plate.

4. The ECU of claim 1, wherein the at least one portion of the support structure is located generally centrally of the cover.

5. The ECU of claim 4, wherein the cover is generally rectangular and the support structure extends substantially between opposing sides of the cover.

6. The ECU of claim 4, wherein the cover is generally rectangular and the support structure extends substantially diagonally between opposing corners of the cover.

7. The ECU of claim 1, wherein the at least one portion of the support structure comprises at least one generally planar surface, the adhesive is disposed between the inner surface of the cover and the at least one generally planar surface, and the at least one generally planar surface of the support structure is in spaced relation with the mounting portion so that the at least one fastener is in a plane different from a plane of the at least one generally planar surface.

8. The ECU of claim 1, wherein the at least one portion of the support structure comprises a first generally planar portion and a second generally planar portion, the first and second generally planar portions being disposed adjacent the cover, the mounting portion having a first end extending from the first generally planar portion and a second end extending from the second generally planar portion, the bore of the mounting portion is disposed at a longitudinally central portion of the mounting portion, and an area of the mounting portion surrounding the through-bore is at a different elevation within the housing relative to an elevation of the first and second generally planar portions.

9. The ECU of claim 1, wherein the at least one fastener is spaced apart from and does not contact the cover, and the adhesive is spaced apart from and does not contact the housing.

10. An engine control unit (ECU) comprising:
a housing,
a cover sealingly engaged with the housing,
a circuit board disposed in the housing,
a support structure disposed in the housing between the cover and the circuit board so as to be generally adjacent to an inner surface of the cover,
at least one fastener coupling both the support structure and the circuit board to the housing, and
an adhesive bonding at least one portion of the support structure to the inner surface of the cover, the adhesive being spaced from and not contacting the housing,
wherein the support structure is constructed and arranged to limit outward deflection of the cover when internal pressure increases in the ECU, and
wherein the at least one fastener comprises a single fastener.

11. The ECU of claim 10, wherein the circuit board includes at least one mounting bore there-through, and the support structure includes at least one mounting portion having a bore there-through, the at least one fastener extending through the bore of the support structure and through the mounting bore of the circuit board in threaded engagement with the housing, the mounting bore of the circuit board, the bore of the mounting portion of the support structure and the at least one fastener are disposed in a generally central portion of the housing and in a longitudinally central portion of the support structure.

12. The ECU of claim 11, wherein the support structure comprises a first planar portion and a second planar portion, the first and second planar portions being disposed adjacent the cover, the mounting portion is disposed between the first planar portion and the second planar portion, and an area of the mounting portion surrounding the through-bore is at a different elevation within the housing relative to an elevation of the first and second planar portions.

13. The ECU of claim 10, wherein the at least one fastener is spaced from and does not contact the cover.

14. The ECU of claim 10, wherein the support structure is metal.

15. The ECU of claim 11, wherein the at least one fastener comprises only one fastener.

16. The ECU of claim 10, wherein the at least one portion of the support structure comprises at least one planar surface, the support structure includes a mounting portion having a bore therethrough, the adhesive is disposed between the inner surface of the cover and the at least one planar surface, and the at least one planar surface of the support structure is in spaced relation with the mounting portion so that the at least one fastener is in a plane different from a plane of the at least one planar surface.

17. The ECU of claim 10, wherein the housing includes a portion that is along a side of the ECU that is opposite a side of the ECU at which the cover is located such that the at least one fastener, the support structure and the adhesive limit the cover from deflecting toward and away from the portion of the housing.

18. The ECU of claim 1, wherein the housing includes a portion that is along a side of the ECU that is opposite a side of the ECU at which the cover is located such that the at least one fastener, the support structure and the adhesive limit the cover from deflecting toward and away from the portion of the housing.

19. An engine control unit (ECU) comprising:
a housing,
a cover sealingly engaged with the housing,
a circuit board disposed in the housing,
a support structure disposed in the housing between the cover and the circuit board so as to be generally adjacent to an inner surface of the cover,
at least one fastener coupling both the support structure and the circuit board to the housing, and
an adhesive bonding at least one portion of the support structure to the inner surface of the cover, the adhesive being spaced from and not contacting the housing,
wherein the support structure is constructed and arranged to limit outward deflection of the cover when internal pressure increases in the ECU,
wherein the circuit board includes at least one mounting bore there-through, and the support structure includes at least one mounting portion having a bore there-through, the at least one fastener extending through the bore of the support structure and through the mounting bore of the circuit board in threaded engagement with the housing, the mounting bore of the circuit board, the bore of the mounting portion of the support structure and the at least one fastener are disposed in a generally central portion of the housing and in a longitudinally central portion of the support structure, and
wherein the at least one fastener comprises only one fastener.

* * * * *